United States Patent
Ziegler

(10) Patent No.: US 8,324,907 B2
(45) Date of Patent: Dec. 4, 2012

(54) ELECTRICAL CONNECTION QUALITY DETECTION

(75) Inventor: William Ziegler, Reading, MA (US)

(73) Assignee: American Power Conversion Corporation, West Kingston, RI (US)

( * ) Notice: Subject to any disclaimer, the term of this patent is extended or adjusted under 35 U.S.C. 154(b) by 406 days.

(21) Appl. No.: 12/692,819

(22) Filed: Jan. 25, 2010

(65) Prior Publication Data

US 2011/0181294 A1 Jul. 28, 2011

(51) Int. Cl.
*G01R 31/04* (2006.01)
(52) U.S. Cl. .......................................................... 324/538
(58) Field of Classification Search .................. 324/538, 324/415, 424
See application file for complete search history.

(56) References Cited

U.S. PATENT DOCUMENTS

| | | | |
|---|---|---|---|
| 5,650,771 A * | 7/1997 | Lee | 340/656 |
| 5,673,028 A | 9/1997 | Levy | |
| 2002/0007464 A1 | 1/2002 | Fung | |
| 2003/0188208 A1 | 10/2003 | Fung | |
| 2003/0196126 A1 | 10/2003 | Fung | |
| 2005/0071093 A1 | 3/2005 | Stefan | |
| 2006/0221521 A1 | 10/2006 | Veroni | |
| 2007/0103833 A1 | 5/2007 | Harris, IV | |

FOREIGN PATENT DOCUMENTS

| | | |
|---|---|---|
| DE | 10319128 B3 | 12/2004 |
| EP | 1821108 A1 | 8/2007 |
| FR | 2767925 A1 | 3/1999 |
| JP | 2005189126 A | 7/2005 |

OTHER PUBLICATIONS

International Search Report and Wratten Opinion in corresponding International Application No. PCT/US2011/022242 dated, May 4, 2011.

* cited by examiner

*Primary Examiner* — Vincent Q Nguyen
(74) *Attorney, Agent, or Firm* — Lando & Anastasi, LLP

(57) ABSTRACT

According to one aspect, embodiments of the invention provide a method of monitoring an electrical connection, the method comprising monitoring a temperature of the electrical connection, monitoring a level of current passing through the electrical connection, and determining, in response to monitoring temperature and current, whether the temperature of the electrical connection exceeds a temperature threshold associated with the level of current passing through the electrical connection.

8 Claims, 2 Drawing Sheets

ELECTRICAL CONNECTION QUALITY DETECTION

BACKGROUND OF INVENTION

1. Field of the Invention

At least one example in accordance with the present invention relates generally to systems and methods for monitoring the quality of an electrical connection.

2. Discussion of Related Art

An electrical contact is a conductive device for joining electrical circuits together. There are a wide variety of electrical contacts which may form different types of connections between circuits. For example, electrical contacts may form a temporary connection, such as with a male plug and female socket used to connect portable or modular devices. In another example, electrical contacts may form a connection which requires a tool for assembly and removal, such as with a screw terminal. In another example, electrical contacts may form a permanent electrical joint between two wires or devices, such as with a welded or soldered connection.

Over time, the connection quality between electrical contacts may become degraded. For example, the connection quality may degrade due to wear on the electrical contacts. Electrical contact wear may result due to corrosion of the electrical contacts, oxidation of the electrical contacts, arcing over the electrical contacts, overheating of the electrical contacts or for some other reason. Electrical contact wear may result in increased resistance in the connection formed by the electrical contacts. Increased resistance may affect the performance of the connection and subsequently the performance of the circuits connected via the electrical contacts. For example, increased resistance may reduce current through the connection and/or increase temperature in the electrical contacts.

The quality of a connection between electrical contacts may also degrade due to a reduction in the surface area of an electrical contact resulting in a reduction in conductivity. For example, an electrical contact screw of a screw terminal, which is intended to form a connection with an electrical contact wire, may become loose causing only a portion of the surface area of the screw to remain in contact with the wire, reducing conductivity and possibly increasing temperature.

SUMMARY OF THE INVENTION

Aspects in accord with the present invention are directed to a system or method for providing high isolation between circuits of a mobile communication device.

In one aspect, the present invention features a method of monitoring an electrical connection. The method may comprise monitoring a temperature of the electrical connection, monitoring a level of current passing through the electrical connection, and determining, in response to monitoring temperature and current, whether the temperature of the electrical connection exceeds a temperature threshold associated with the level of current passing through the electrical connection.

According to one embodiment, the method may further comprise varying a connection quality of the electrical connection, varying the level of the current passing through the electrical connection, and examining a temperature response of the electrical connection to varying the connection quality and the level of current.

According to another embodiment, the method may further comprise determining, based on examining, a relationship between the temperature response of the electrical connection and the quality of the electrical connection, the relationship being associated with the level of current passing through the electrical connection. In another embodiment, the act of determining is performed periodically.

According to another embodiment, the method may further comprise developing, based on determining a relationship, the temperature threshold, associating the temperature threshold with the level of current passing through the electrical connection, and storing the temperature threshold and corresponding level of current in memory.

According to another embodiment, the method may further comprise providing a warning in response to a determination that the at least one temperature threshold has been exceeded.

According to another embodiment, the method may further comprise recording the temperature of the electrical connection and the level of the current through the electrical connection into a time based log. In another embodiment, the act of recording includes recording a baseline temperature and current relationship into the time based log, and wherein the act of determining includes comparing a present temperature of the electrical connection and a present level of current through the electrical connection with the baseline temperature and current relationship.

In another aspect, the present invention features a system for monitoring the quality of an electrical connection. The system may comprise at least one electrical circuit having at least one electrical connection, a temperature sensor configured to detect a temperature associated with the at least one electrical connection, a current sensor configured to detect a current through the at least one electrical connection, and a controller coupled to an output of the temperature sensor and an output of the current sensor, wherein the controller is configured to receive a temperature indication from the temperature sensor and a current indication from the current sensor and compare the temperature indication with a temperature threshold associated with the current indication.

According to one embodiment, the controller may be further configured to provide a warning in response to a determination that the temperature indication has exceeded the temperature threshold.

According to another embodiment, the system may further comprise a user interface, wherein the warning is provided via the user interface.

According to another embodiment, the temperature threshold associated with the current indication may be stored in a database.

According to another embodiment, the system may further comprise a bus coupled between the controller and the outputs of the temperature and current sensors. According to another embodiment, the current sensor may be an in-line current sensor.

In another aspect, the present invention features a system for monitoring an electrical connection. The system may comprise at least one electrical circuit having at least one electrical connection, and means for monitoring quality of the at least one electrical connection by monitoring temperature associated with the electrical connection and current through the electrical connection.

According to another embodiment, the system may further comprise means for determining a relationship between temperature response of the at least one electrical connection and the quality of the at least one electrical connection, wherein the relationship is associated with a level of current through the electrical connection.

According to another embodiment, the system may further comprise means for developing at least one temperature threshold associated with the level of current through the electrical connection. According to another embodiment, the system may further comprise means for determining whether the temperature associated with the electrical connection has exceeded the at least one temperature threshold.

According to another embodiment, the system may further comprise means for providing a warning in response to a determination that the at least one temperature threshold has been exceeded.

According to another embodiment, the system may further comprise means for recording the monitored temperature of the at least one electrical connection and the monitored level of current passing through the at least one electrical connection.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Figure 1:
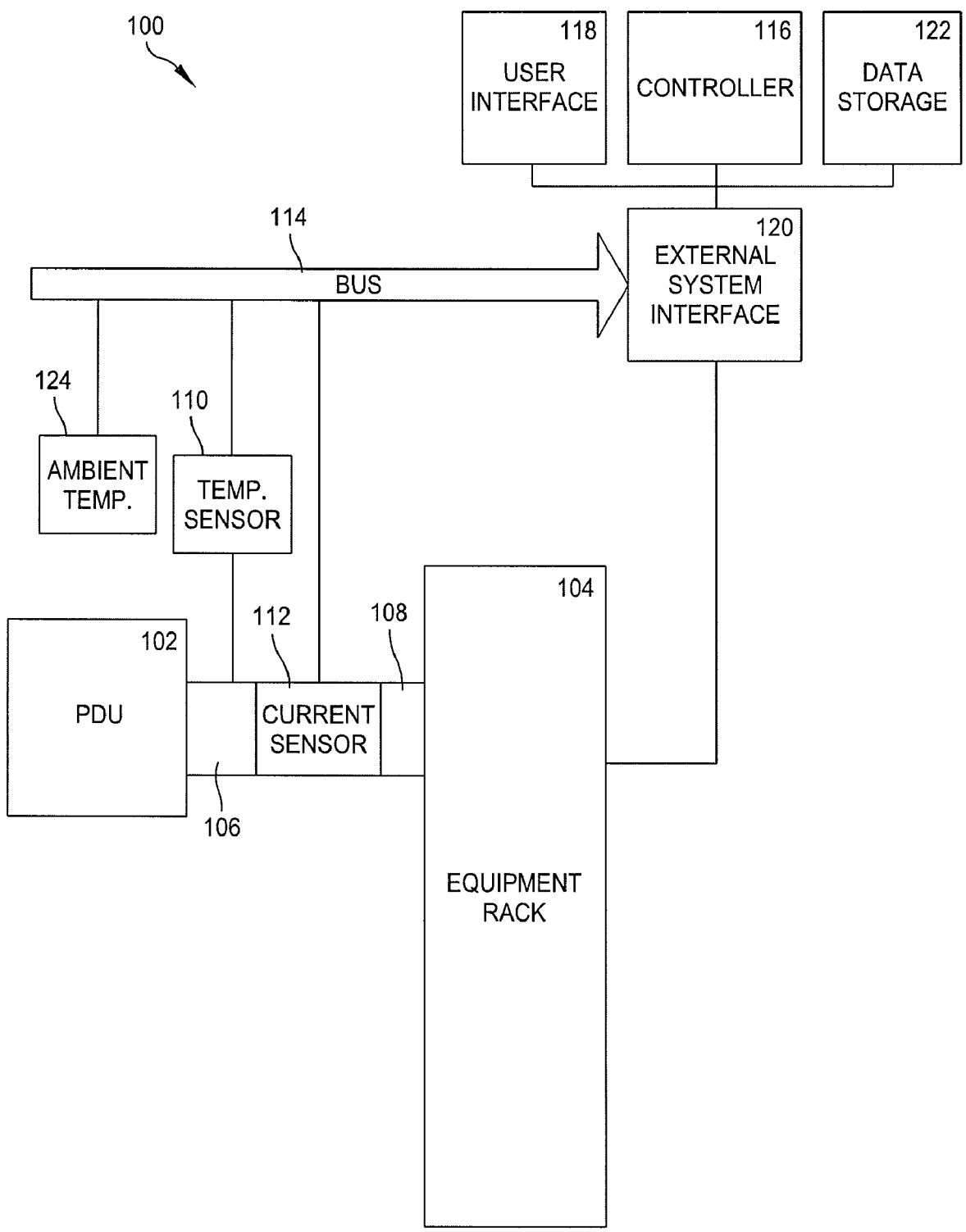
FIG. 1 is an example block diagram of a system for monitoring connection quality in accordance with the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Electrical contact wear (and hence electrical connection quality) may be evaluated by thermal scanning the electrical contacts using an Infrared (IR) camera. As discussed above, because an increase in temperature of an electrical contact may signal a connection problem, the electrical contacts may be periodically checked for any changes in temperature which may indicate a connection problem.

The method of thermally scanning electrical contacts may be used in datacenters. For example, during a scheduled preventive maintenance cycle, an IR camera may be used to scan electrical contacts for any outstanding or uneven readings.

Applicant appreciates that the method of thermally scanning electrical contacts in a datacenter (or any high powered electrical device) has certain disadvantages. For example, to successfully thermally scan electrical contacts within a datacenter, the operator of the IR camera must access the internal circuitry of the datacenter and operate near live electrical parts. Additionally, all electronic contacts which are to be evaluated must be accessible by the operator of the camera. Also, because this is a hazardous and time consuming process, the thermal scanning of contacts may be limited to being performed during scheduled preventive maintenance (i.e. once or twice a year). During the time between maintenance, a problem with an electrical contact may arise and remain unnoticed until the next preventive maintenance cycle. Finally, scanning electrical contacts with an IR camera does not provide any solid reference that can be used as a pass/fail criterion. The decision falls to the operator of the IR camera whether the electrical contact is having connection problems. This subjective testing may lead to varying results and/or user error.

Previous attempts at avoiding some of the disadvantages of thermally scanning electrical contacts include the elimination of connections and the creation of redundancies. However, it may not be possible to eliminate all connections or create enough redundancies.

As a result, applicant appreciates that a method of detecting connection quality between electrical contacts without having to wait for a preventive maintenance cycle, without having to expose a user to electrical hazards and without having to individually scan an electrical connection is desired.

FIG. 1 shows a system 100 for detecting electrical connection quality according to one embodiment of the current invention. According to one embodiment, the system 100 is a datacenter containing computing equipment. The system 100 includes a first electronic circuit 102, a second electronic circuit 104, a temperature sensor 110, a current sensor 112, a controller 116, external system interface 120, user interface 118, data storage 122 and a bus 114. In the example shown in FIG. 1, the first electronic circuit 102 is a modular Power Distribution Unit (PDU) and the second electronic circuit 104 is an equipment rack. According to one embodiment, the PDU 102 is capable of being installed in the equipment rack 104. In another embodiment, the PDU 102 is removable from the equipment rack 104. In another example, the system 100 may also include additional sensors, for example, an ambient temperature sensor 124. However, it should be appreciated that even though examples in accordance with the present invention are described herein for use with a PDU and an equipment rack of a datacenter, other examples may be used with any other type of power connection utilizing electrical connectors.

The modular PDU 102 may include a first electrical connector 106. The equipment rack 104 may include a second electrical connector 108 configured to couple with the first electrical connector 106 of the modular PDU 102. It should be appreciated that both the modular PDU 102 and the equipment rack 104 may include any number of electrical connectors and the electrical connectors can be of any type.

According to one example, the temperature sensor 110 is coupled to the first electrical connector 106 and is configured to detect a temperature associated with the first electrical connector 106. However, it should be appreciated that the temperature sensor 110 may be coupled to any one of the electrical connectors 106, 108. In one example, an output of the temperature sensor 110 may be coupled to the bus 114 and the bus 114 may be coupled to the controller 116 via the external system interface 120. In one example, the bus is a Controller Area Network (CAN) bus. According to another example, the system 100 may include more than one bus, each for receiving signals from at least one sensor. According to another example, the output of the temperature sensor 110 may be coupled directly to the controller 116 via the external system interface 120. It should be appreciated that the system 100 may include any number of temperature sensors for monitoring the temperature of any number of electrical connectors. Further, it also should be appreciated that the temperature sensor 110 may be any circuit which is capable of providing an indication of temperature, such as, for example, a thermistor or thermocouple. It also should be appreciated that the temperature sensor 110 may be located anywhere in the system 100 (i.e. outside the PDU, inside the PDU, inside the equipment rack), as long as the temperature sensor 110 is able to monitor the temperature of the first electrical connection 106.

In one example, the current sensor 112 is coupled as an in-line current sensor, between the first electrical connector 106 and the second electrical connector 108, and is configured to detect a current through the first electrical connector 106 and second electrical connector 108. An output of the current sensor 112 may be coupled to the bus 114 and the bus 114 may be coupled to the controller via the external system interface 120. According to another example, the system 100 may include more than one bus, each for receiving signals from at least one sensor. In another example, the output of the current sensor 112 may be coupled directly to the controller 116 via the external system interface. It should be appreciated that the system 100 may include any number of current sensors for monitoring the current between any number of different electrical connectors. Further, it also should be appreciated that the current sensor 112 does not need to be an in-line current sensor, located between the first electrical connection 106 and the second electrical connection 108, as long as it is located somewhere within the system 100 so as to be able to monitor the current between the first electrical connection 106 and the second electrical connection 108 (i.e. in the PDU or in the equipment rack).

In one example, the ambient temperature sensor 124 may be located within the system 100 and be configured to monitor the ambient temperature of the system 100. The ambient temperature sensor 124 may be coupled to the bus 114. In another example, the ambient temperature sensor 124 may be coupled directly to the controller 116 via the external system interface 120.

As discussed above, the first electrical connection 106 and the second electrical connection 108 may be configured to be coupled together. Upon coupling the first electrical connector 106 and the second electrical connector 108 together, the PDU 102 and the equipment rack 104 may be in electronic communication. While the electrical connectors 106, 108 are coupled together, the temperature sensor 110 may be configured to monitor the temperature of the electrical connector to which it is coupled (i.e. 106). An indication of the temperature of the electrical connector 106 may be provided to the output of the temperature sensor 110. In one example, the temperature indication from the output of the temperature sensor 110 may be received by the bus 114 and provided to the controller 116 via the external system interface 120. In another example, the temperature indication may be provided directly from the output of the temperature sensor 110 to the controller 116 via the external system interface 120.

Also while the electrical connectors 106, 108 are coupled together, the current sensor 112 may monitor current between the first electrical connection 106 and the second electrical connection 108. An indication of the current may be provided to an output of the current sensor 112. In one example, the indication of the current from the output may be received by the bus 114 and provided to the controller 116 via the external system interface 120. In another example, the current indication may be provided directly from the output of the current sensor 112 to the controller 116 via the external system interface 120.

In another example, while the electrical connectors 106, 108 are coupled together, the ambient temperature sensor 124 may monitor the ambient temperature of the system 100 and provide an indication of ambient temperature to an output of the sensor 124. In one example, the indication of the ambient temperature from the output may be received by the bus 114 and provided to the controller 116 via the external system interface 120. In another example, the ambient temperature indication may be provided directly from the output of the ambient temperature sensor 124 to the controller 116 via the external system interface 120.

Using data stored in associated memory or in data storage 122, the controller 116 may perform one or more instructions that may result in manipulated data. Also in response to one or more instructions, the controller 116 may monitor and control operation of the system 100. In some examples, the controller 116 may include one or more processors or other types of controllers. In one example, the controller 116 is a commercially available, general purpose processor. In another example, the controller 116 performs a portion of the functions disclosed herein on a general purpose processor and performs another portion using an application-specific integrated circuit (ASIC) tailored to perform particular operations. As such, embodiments in accordance with the present invention may perform the operations described herein using many specific combinations of hardware and software and the invention is not limited to any particular combination of hardware and software components.

The data storage 122 stores computer readable and writable information required for the operation of the controller 116. This information may include, among other data, data subject to manipulation by the controller 116 and instructions that are executable by the controller 116 to manipulate data. The data storage 32 may be a relatively high performance, volatile, random access memory such as a dynamic random access memory (DRAM) or static memory (SRAM) or may be a nonvolatile storage media such as magnetic disk or flash memory. In one example, the data storage 122 includes both volatile and non-volatile storage. Various examples in accord with the present invention can organize the data storage 122 into particularized and, in some cases, unique structures to perform the aspects and functions disclosed herein. In addition, these data structures may be specifically configured to conserve storage space or increase data exchange performance.

The external system interface 120 exchanges data with one or more external devices. These external devices may include any device configured to communicate using standards and protocols supported by the system 100. Examples of specific standards and protocols that the external system interface 120 may support include parallel, serial, and USB interfaces. Other examples of these supported protocols and standards include networking technologies such as UDP, TCP/IP and Ethernet technologies. In at least some examples, the external system interface includes a network management card (NMC) and a USB interface.

The user interface 118 includes a display screen and a set of keys through which a user of the system 100 can monitor, control and configure operation of the system 100.

As illustrated in FIG. 1, the controller 116, user interface 118, external system interface 120 and data storage are located outside of the equipment rack 104; however, it should be appreciated that the controller 116, user interface 118, external system interface 120 and data storage 122 may be located anywhere else, for example within another system or within the equipment rack 104 itself.

According to one example, a user may enter guidelines into the user interface which in turn are stored in the data storage 122. The guidelines may be configured to instruct the controller 116 on how to operate the system 100 in response to varying temperature and current indications received from the temperature sensor 110 and current sensor 112 via the external system interface 120. The specific operation of the controller 116 in response to signals from the temperature 110 and current 112 sensors will be discussed in greater detail below, with reference to FIGS. 1 and 2.

Figure 2:
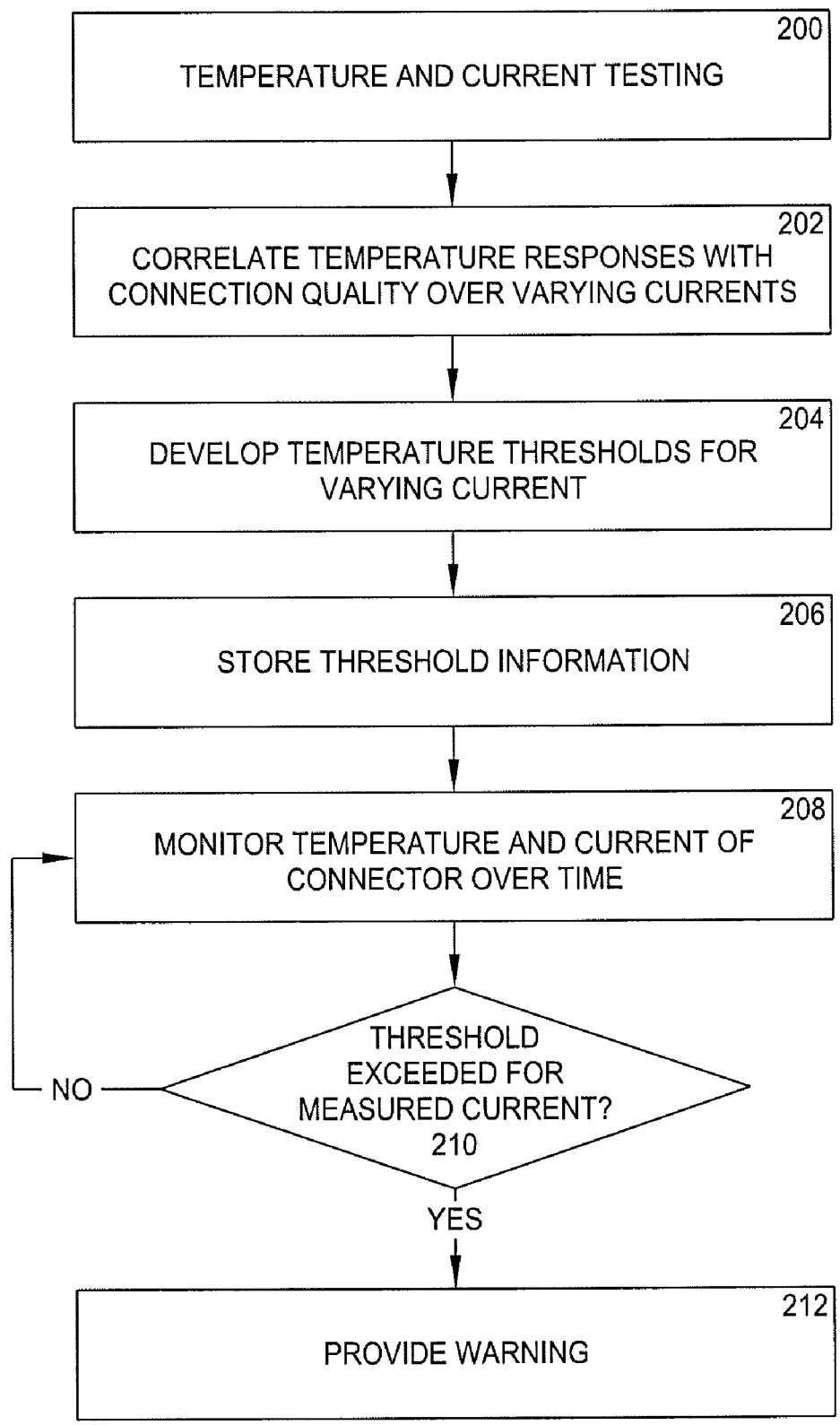
FIG. 2 is a flow diagram of a process for monitoring connection quality in accordance with the present invention.

FIG. 2 illustrates one embodiment of a method of operation of the system 100 for monitoring connection quality according to one embodiment of the current invention.

At block 200, a user or operator may test the response of the system 100 to varying conditions. For example, the user may vary the connection quality between the first connector 106 and the second connector 108. In another example, the user may also vary the current level passing between the first connector 106 and the second connector 108. By monitoring, in response to the varying conditions, the temperature response of the electrical connector 106 along with the current indications, the relationship between temperature and connection quality of the electrical connector 106 may be determined at different current levels. For example, in monitoring the sensors 110, 112, the user may determine what effect, if any, the changes in connection quality and/or current have on the temperature of the electrical connector 106.

At block 202, in response to monitoring the behavior of the electrical connector 106 over varying current and connection quality conditions, the user may correlate temperature responses of the electrical connection 106 with corresponding connection quality over a range of varying currents. For example, a user may determine that over a current range of 1 to 5 amps, a good connection quality will produce a temperature of about 70 degrees in the first electrical connection, and a bad connection quality will produce a temperature of about 140 degrees in the first electrical connection. Additionally, the user may also determine that over a current range of 5-10 amps, a good connection quality will produce a temperature of about 80 degrees in the first electrical connection, and a bad connection quality will produce a temperature of about 240 degrees in the first electrical connection. It should be appreciated that the previous temperature and connection quality correlation examples are for illustrative purposes only and that the temperature and connection quality correlations developed by the user over a current range may encompass any range of currents and may be defined in any way.

At block 204, based on the correlation of temperature and connection quality performed at block 202, the user may define a series of temperature thresholds. In one example, a temperature threshold may indicate an electrical connection temperature for a defined current range that, if exceeded, would signal a potential connection quality issue. For example, consistent with the example above, the user may define a temperature threshold to be 140 degrees at a current range of 1 to 5 amps. If the temperature of the electrical connection 106 exceeds 140 degrees and the current between electrical connectors 106, 108 falls within the range of 1 to 5 amps, then the user knows there may be a connection quality problem between electrical connectors 106, 108. Similarly, the user may define another temperature threshold to be 240 degrees at a current range of 5-10 amps. If the temperature of the electrical connection 106 exceeds 240 degrees and the current between electrical connectors 106, 108 falls within the range of 5 to 10 amps, then the user knows there may be a connection quality problem between electrical connectors 106, 108. It should be appreciated that the previous threshold examples are for illustrative purposes only and that any number of thresholds may be developed to cover any number of current ranges and the thresholds and current ranges may be defined in any way. For example, the temperature thresholds may be related to the rate of change of the temperature indication.

At block 206, the temperature thresholds and corresponding current ranges may be input into the controller 116 by a user through the user interface 118 and stored in memory for future use by the controller 116. In one example, the temperature thresholds and corresponding current ranges may be stored in data storage 122. In another example, the temperature thresholds and corresponding current ranges may be stored in internal memory within the controller 116. In another example, the temperature thresholds and corresponding current ranges may be stored in a database.

At block 208, the temperature indication from the temperature sensor 110 and the current indication from the current sensor 112 are monitored by the controller 116 via the external system interface 120 over time. In one example, the controller 116 monitors the temperature sensor 110 and the current sensor 112 and maintains a time based log of the temperature and current indications. In one example, the time based log may be stored in internal memory of the controller 116. In another example, the time based log may be stored in data storage 122. By monitoring the temperature and current indications over time, the controller 116 may determine whether a temperature threshold has been exceeded. Also, it should be appreciated that the controller 116 may be programmed to monitor the temperature and current indications continuously or at any other different defined interval. In one example, the controller 116 may be programmed to monitor the temperature and current indications every hour. In another example, the controller 116 may be programmed to monitor the temperature and current indications every week.

At block 210, upon referencing the temperature thresholds and current ranges stored in memory along with the time based log of temperature and current indications, a determination can be made, by the controller 116, whether the received temperature indication from the temperature sensor 110 exceeds a certain temperature threshold associated with the received current indication from the current sensor 112. For example, in response to receiving both temperature and current indications, if the controller 116 identifies that a received temperature indication has increased in relation to a previous temperature indication stored in the time based log, the controller may access the stored temperature threshold corresponding to the received current indication. The controller 116 may compare the received temperature indication with the temperature threshold associated with the received current indication to determine whether the temperature indication has exceeded the temperature threshold. In response to a determination that the temperature threshold has not been exceeded, the controller 116 will continue to monitor the temperature and current indications.

At block, 212, in response to a determination that the corresponding temperature threshold has been exceeded, the controller 116 may provide notification of the connection quality problem. According to one example, in response to a determination that the corresponding temperature threshold has been exceeded, the controller 116 provides a warning to the user interface 118. According to one embodiment, in response to a determination that the corresponding temperature threshold has been exceeded, the controller 116 may activate an alarm. In another embodiment, in response to a determination that the corresponding temperature threshold has been exceeded, the controller 116 may send an email to the user of the system 100. According to another example, in response to a determination that the corresponding temperature threshold has been exceeded, the controller 116 may operate the equipment rack 104, via the external system interface 120, to either turn off entirely, turn off the problem connection, or take some other corrective measure.

In one example, in addition to monitoring the temperature and current indications, the controller 116 my also monitor the ambient temperature from the ambient temperature sensor 124. In this way, the controller 116 may be able to determine if a rise in temperature of the electrical connector 106 is due only to a rise in ambient temperature or is actually a result of a connection problem.

According to another embodiment of a method of operation of the system 100, the controller 116 may be configured to automatically sense an initial baseline temperature and current relationship of the electrical connector 106 upon powering up of the electrical connector 106 and determine connection quality of the electrical connector 106 by comparing sensed temperature and current indications from the temperature sensor 110 and current sensor 112 to the initial temperature and current relationship.

For example, according to one embodiment, upon powering up of the electrical connector 106, the controller 116 may store, in a time based log, the initial temperature and current indications from the temperature sensor 110 and current sensor 112 as baseline indications. After storing the baseline indications in a time based log, the controller 116 may continue to monitor the temperature and current indications from the temperature sensor 110 and current sensor 112 and store the indications in the time based log. If the controller 116 identifies that the temperature of the electrical connector 106 or the current through the electrical connector 106 has changed, the controller 116 may activate a warning that there may be a connection quality problem. According to one embodiment, the percentage of change in temperature or current required before the controller 116 activates a warning may be determined by a user. According to another embodiment, in addition to storing baseline temperature and current indications, the controller 116 may also store baseline ambient temperature indications and monitor for changes in ambient temperature.

In another example of the current invention, the controller 116 may also be able to adapt to configuration changes in the system 100. For example, as discussed in relation to FIG. 1, a single modular PDU 102 may be connected to the equipment rack 104. However, it may also be possible for the equipment rack 104 to be connected to more than one modular unit such as additional PDU's or even a different type of modular circuit, such as a circuit breaker. The addition and removal of modular circuits may impact the performance of adjacent circuits, especially if adjacent circuits share any contacts or leads. For example, the addition of a circuit breaker may cause the thermal condition of the adjacent PDU to change. As a result, the controller 116 may be programmed to automatically compensate for the addition and removal of modular circuits so that the changing thermal condition does not trigger a false connection warning.

Additionally, in another example, the behavior of one circuit may impact the thermal condition of an adjacent circuit. For example, if a modular circuit breaker is tripped, it may have an impact on the thermal condition of an adjacent circuit. As a result, the controller 116 may be programmed to automatically compensate for the changing thermal condition due to the circuit breaker being tripped so that the tripping of the circuit breaker alone does not cause a connection warning in an adjacent circuit.

It should be appreciated that even though examples in accordance with the present invention are described herein with some of the blocks being performed by a user, other examples may include the use of a controller or microprocessor to perform such blocks.

It also should be appreciated that even though examples in accordance with the present invention are described herein for use in monitoring the electrical connection quality between two electrical connectors, other examples may be used to monitor the quality of any power connection in which connection quality is a priority, such as, for example, a transformer coil, a bus, a circuit breaker or high powered switch.

Aspects and examples of methods and systems for monitoring connection quality have been described. As discussed above, by using a temperature sensor and current sensor to monitor an electrical connection, an operator may not be required to dangerously access the live internal circuitry of the electrical connection, electrical components of the connection may be made more compact and placed in a row, the quality of the electrical connection may be determined more frequently preventing possible damage, and connection quality may be determined accurately and consistently.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of monitoring an electrical connection, the method comprising:
   monitoring a temperature of the electrical connection;
   monitoring a level of current passing through the electrical connection; and
   determining, in response to monitoring temperature and current, whether the temperature of the electrical connection exceeds a temperature threshold associated with the level of current passing through the electrical connection to determine a quality of the electrical connection.

2. The method of claim 1, further comprising:
   testing a response of the electrical connection to varying conditions by:
      varying a connection quality of the electrical connection; and
      varying the level of the current passing through the electrical connection; and
   examining a temperature response of the electrical connection to varying the connection quality and the level of current.

3. The method of claim 2, further comprising:
   determining, based on examining, a relationship between the temperature response of the electrical connection and the quality of the electrical connection, the relationship being associated with the level of current passing through the electrical connection.

4. The method of claim 3, further comprising:
   developing, based on determining a relationship, the temperature threshold;
   associating the temperature threshold with the level of current passing through the electrical connection; and
   storing the temperature threshold and corresponding level of current in memory.

5. The method of claim 1, further comprising providing a warning in response to a determination that the at least one temperature threshold has been exceeded.

6. The method of claim 1, wherein the act of determining is performed periodically.

7. The method of claim 1, further comprising recording the temperature of the electrical connection and the level of the current through the electrical connection into a time based log.

8. The method of claim 7, wherein the act of recording includes recording a baseline temperature and current relationship into the time based log, and wherein the act of determining includes comparing a present temperature of the electrical connection and a present level of current through the electrical connection with the baseline temperature and current relationship.

* * * * *

UNITED STATES PATENT AND TRADEMARK OFFICE
CERTIFICATE OF CORRECTION

PATENT NO. : 8,324,907 B2  
APPLICATION NO. : 12/692819  
DATED : December 4, 2012  
INVENTOR(S) : William Ziegler Page 1 of 1

It is certified that error appears in the above-identified patent and that said Letters Patent is hereby corrected as shown below:

In the Specification:

Column 8, line number 67, delete the word "my" and replace it with --may--.

Signed and Sealed this
Fifth Day of February, 2013

Teresa Stanek Rea
*Acting Director of the United States Patent and Trademark Office*